United States Patent [19]

Fontana, Jr. et al.

[11] Patent Number: 5,701,223
[45] Date of Patent: Dec. 23, 1997

[54] SPIN VALVE MAGNETORESISTIVE SENSOR WITH ANTIPARALLEL PINNED LAYER AND IMPROVED EXCHANGE BIAS LAYER, AND MAGNETIC RECORDING SYSTEM USING THE SENSOR

[75] Inventors: Robert Edward Fontana, Jr., San Jose; Bruce Alvin Gurney, Santa Clara; Tsann Lin, Saratoga; Virgil Simon Speriosu, San Jose; Ching Hwa Tsang, Sunnyvale; Dennis Richard Wilhoit, Morgan Hill, all of Calif.

[73] Assignee: International Business Machines Corporation, Armonk, N.Y.

[21] Appl. No.: 697,396

[22] Filed: Aug. 23, 1996

Related U.S. Application Data

[63] Continuation of Ser. No. 497,324, Jun. 30, 1995, abandoned.
[51] Int. Cl.$^6$ .................................................. G11B 5/39
[52] U.S. Cl. .................................................. 360/113
[58] Field of Search ........................ 360/113; 324/252, 324/207.21; 338/32 R

[56] References Cited

U.S. PATENT DOCUMENTS

| | | | |
|---|---|---|---|
| 5,159,513 | 10/1992 | Dieny et al. | 360/113 |
| 5,206,590 | 4/1993 | Dieny et al. | 324/252 |
| 5,287,238 | 2/1994 | Baumgart et al. | 360/113 |
| 5,343,422 | 8/1994 | Kung et al. | 360/113 X |
| 5,408,377 | 4/1995 | Gurney et al. | 360/113 |
| 5,422,571 | 6/1995 | Gurney et al. | 324/252 |
| 5,465,185 | 11/1995 | Heim et al. | 360/113 |

FOREIGN PATENT DOCUMENTS

| | | |
|---|---|---|
| 0 611 033 A2 | 8/1994 | European Pat. Off. . |
| 0 687 917 A2 | 12/1995 | European Pat. Off. . |

OTHER PUBLICATIONS

Thomas C. Anthony et al., "Magnetoresistance of Symmetric Spin Valve Structures", IEEE Transactions on Magnetics, vol. 30, No. 6, Nov. 1994, pp. 3819–3821.

H. Hoshiya et al., "Giant Magnetoresistance of Spin Valve Films with NiO Antiferromagnetic Films", Journal of the Magnetism Society of Japan, vol. 18, No. 2, 1994, pp. 355–359.

Primary Examiner—Stuart S. Levy
Assistant Examiner—William R. Korzuch
Attorney, Agent, or Firm—Thomas R. Berthold

[57] ABSTRACT

A spin valve magnetoresistive (SVMR) sensor uses a laminated antiparallel (AP) pinned layer in combination with an improved antiferromagnetic (AF) exchange biasing layer. The pinned layer comprises two ferromagnetic films separated by a nonmagnetic coupling film such that the magnetizations of the two ferromagnetic films are strongly coupled together antiferromagnetically in an antiparallel orientation. This laminated AP pinned layer is magnetically rigid in the small field excitations required to rotate the SVMR sensor's free layer. When the magnetic moments of the two ferromagnetic layers in this AP pinned layer are nearly the same, the net magnetic moment of the pinned layer is small. However, the exchange field is correspondingly large because it is inversely proportional to the net magnetic moment. The laminated AP pinned layer has its magnetization fixed or pinned by an AF material that is highly corrosion resistant but that has an exchange anisotropy too low to be usable in conventional SVMR sensors. In the preferred embodiment the AF layer is nickel-oxide and is formed on one of the magnetoresistive (MR) shields that serves as the substrate. Thus the AF material also serves as the insulating MR gap material. The location of the AF layer and the laminated AP-pinned layer to which it is exchange coupled on the bottom of the SVMR sensor allows for improved longitudinal biasing of the free layer when the SVMR sensor is fabricated.

20 Claims, 8 Drawing Sheets

A — — /30Å Co/140Å Fe$_{50}$Mn$_{50}$/— —
B — —/10Å Co/30Å NiFe/140Å (Fe$_{50}$Mn$_{50}$)$_{97}$Cr$_3$/— —
C — —/20Å Co/6Å Ru/20Å Co/150Å (Fe$_{50}$Mn$_{50}$)$_{97}$Cr$_3$/— —

SPIN VALVE MAGNETORESISTIVE SENSOR WITH ANTIPARALLEL PINNED LAYER AND IMPROVED EXCHANGE BIAS LAYER, AND MAGNETIC RECORDING SYSTEM USING THE SENSOR

This is a continuation of application Ser. No. 08/497,324 filed on Jun. 30, 1995, now abandoned.

TECHNICAL FIELD

This invention relates generally to a magnetoresistive (MR) sensor based on the spin valve effect for sensing magnetic fields, and more particularly to such a sensor having a laminated antiparallel pinned layer and an improved antiferromagnetic exchange coupling layer for pinning the pinned layer, and to a magnetic recording system that incorporates such a sensor.

BACKGROUND OF THE INVENTION

Conventional magnetoresistive (MR) sensors, such as those used in magnetic recording disk drives, operate on the basis of the anisotropic magneteresistive effect in which a component of the read element resistance varies as the square of the cosine of the angle between the magnetization in the read element and the direction of sense current flow through the read element. Recorded data can be read from a magnetic medium because the external magnetic field from the recorded magnetic medium (the signal field) causes a change in the direction of magnetization in the read element, which in turn causes a change inn resistance in the read element and a corresponding change in the sensed current or voltage.

A different and more pronounced magnetoresistance, called giant magnetoresistance (GMR), has been observed in a variety of magnetic multilayered structures, the essential feature being at least two ferromagnetic metal layers separated by a nonferromagnetic metal layer. The physical origin of the GMR effect is that the application of an external magnetic field causes a variation in the relative orientation of neighboring ferromagnetic layers. This in turn causes a change in the spin-dependent scattering of conduction electrons and thus the electrical resistance of the structure. The resistance of the structure thus changes as the relative alignment of the magnetizations of the ferromagnetic layers changes.

A particularly useful application of GMR is a sandwich structure comprising two uncoupled ferromagnetic layers separated by a nonmagnetic metallic layer in which the magnetization of one of the ferromagnetic layers is pinned. The pinning may be achieved by depositing the layer onto an antiferromagnetic layer, such as iron-manganese (Fe—Mn), to exchange couple the two layers. This results in a spin valve magnetoresistive (SVMR) sensor in which only the unpinned or free ferromagnetic layer is free to rotate in the presence of any small external magnetic field. IBM's U.S. Pat. No. 5,206,590 discloses a basic SVMR sensor. IBM's U.S. Pat. No. 5,465,185, describes a SVMR sensor wherein the pinned layer is a laminated structure of two ferromagnetic films separated by a nonmagnetic coupling film such that the magnetizations of the two ferromagnetic films are strongly coupled together antiferromagnetically in an antiparallel orientation.

Most previously described SVMR sensors use Fe—Mn, typically $Fe_{50}Mn_{50}$, as the antiferromagnetic layer deposited on the pinned layer for exchange coupling to fix or pin the magnetization of the pinned layer. Through exchange anisotropy with the Fe—Mn antiferromagnet, the magnetization of the pinned layer is held rigid against small field excitations, such as those that occur from the signal field to be sensed. Fe—Mn couples to nickel-iron (Ni—Fe), cobalt (Co), and iron (Fe) with an interfacial energy of 0.08 erg/cm$^2$, and therefore is able to provide an exchange bias field in excess of the 200 Oerstead (Oe) for typical pinned layer magnetic moments. This is sufficient exchange energy to provide reasonably stable SVMR sensors. However, because Fe—Mn has poor corrosion properties, it is desirable that SVMR sensors without it be developed. There are a number of alternative antiferromagnet candidates with better corrosion properties than Fe—Mn that might be capable of use in SVMR sensors. However, these corrosion-resistant antiferromagnetic materials either have too small an exchange anisotropy or produce too high a coercivity in the exchange-biased pinned layer. The use of nickel-oxide (NiO) as a replacement for Fe—Mn in SVMR sensors has been described by H. Hoyashi et al., *Journal of the Magnetism Society of Japan*, Vol. 18, p. 355 (1994); and T. C. Anthony et al., *IEEE Transactions on Magnetics*, Vol. MAG-30, p. 3819 (1994). However, these results showed exchange bias fields of only about 100 Oe, which are too low for SVMR sensor applications. Also, the NiO resulted in relatively high coercivities of about 50 Oe for the single layer pinned layer. The combination of this low exchange field and high coercivity is unacceptable because the pinned layer is unstable against the application of moderate fields, including the demagnetizing field arising from the pinned layer itself.

Most previously described SVMR sensors also have the free layer on the bottom or adjacent to the sensor substrate with the pinned layer on top. Because SVMR read sensors for magnetic recording disk drives will be required to be used with very narrow track widths on the magnetic media, SVMR sensor structures with sophisticated longitudinal bias of the free layer will be required for magnetic domain noise suppression. One proposed scheme requires that the free layer be on top of the structure, with the pinned layer on the bottom or adjacent to the sensor substrate. However, it is not possible to merely invert the order of deposition of the spin valve layers and obtain the same film properties because of the differences in how the layers grow on one another. All SVMR sensors have an interlayer exchange coupling field ($H_i$) between the free and pinned layers caused by such things as magnetostatic interactions, pin holes in the films and electronic effects. It is desirable to have a SVMR sensor with a generally low $H_i$. However, SVMR sensors with the pinned layer on the bottom would require thinner Fe—Mn layers (e.g., 90 Å instead of 150 Å) to obtain an $H_i$ lower than approximately 25 Oe. But these thinner Fe—Mn layers are undesirable because they have a lower blocking temperature (e.g., 130 degC. vs. 160 degC.). The blocking temperature is the temperature above which the exchange field between the Fe—Mn antiferromagnetic layer and the pinned layer vanishes.

SVMR sensors exhibit the desired level of magnetoresistance (deltaR/R between the parallel and antiparallel alignments of the magnetizations of the pinned and free layers) at very small thicknesses. Thus, to achieve very high density recording the MR read gap between the two MR shields must be very thin, typically below 2000 Å. This places constraints upon the electrical continuity of the gap material, which must electrically isolate the SVMR sensor from one or both of the MR shields.

What is needed is an SVMR sensor that has a corrosion-resistant antiferromagnet that also provides good exchange anisotropy for the pinned layer and that has a blocking temperature higher than approximately 130 degC. The antiferromagnet should also be able to serve as the insulating material in the MR read gap.

SUMMARY OF THE INVENTION

The SVMR sensor according to the present invention uses a laminated antiparallel (AP) pinned layer in combination with an improved antiferromagnetic (AF) layer. In this structure, the pinned layer comprises two ferromagnetic films separated by a nonmagnetic coupling film such that the magnetizations of the two ferromagnetic films are strongly coupled together antiferromagnetically in an antiparallel orientation. This laminated AP pinned layer is magnetically rigid in the small field excitations required to rotate the free layer. When the magnetic moments of the two ferromagnetic layers in this AP pinned layer are nearly the same, the net magnetic moment of the pinned layer is small. As a consequence, the exchange field is correspondingly large because it is inversely proportional to the net magnetic moment. The laminated AP pinned layer has its magnetization fixed or pinned by an AF material that is highly corrosion resistant but that has an exchange anisotropy too low to be usable in conventional SVMR sensors. In the preferred embodiment the AF layer is NiO and is formed on one of the MR shields that serves as the substrate. Thus the AF material also serves as the insulating MR gap material. The location of the AF layer and the laminated AP-pinned layer to which it is exchange coupled on the bottom of the SVMR sensor allows for improved longitudinal biasing of the free layer when the SVMR sensor is fabricated.

For a fuller understanding of the nature and advantages of the present invention, reference should be made to the following detailed description taken together with the accompanying figures.

DETAILED DESCRIPTION OF THE INVENTION PRIOR ART

Figure 1:
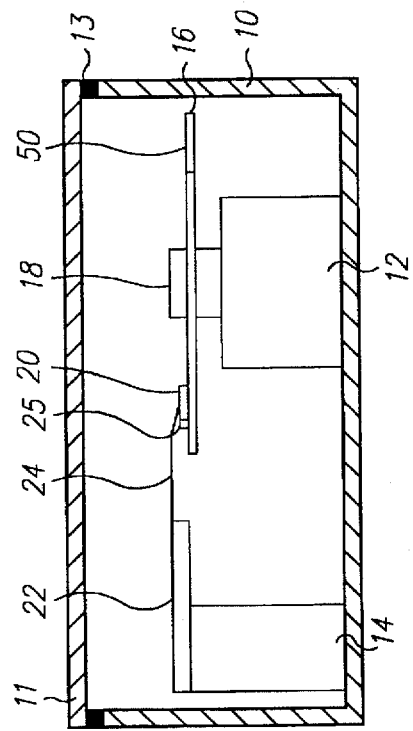
FIG. 1 is a simplified block diagram of a magnetic recording disk drive for use with the SVMR sensor according to the present invention.

Although the SVMR sensor of the present invention will be described as embodied in a magnetic disk storage system, as shown in FIG. 1, the invention is also applicable to other magnetic recording system, such as a magnetic tape recording system, and to magnetic random access memory systems wherein a magnetoresistive element serves as a bit cell.

Referring to FIG. 1, there is illustrated in sectional view a schematic of a prior art disk drive of the type using an MR sensor. The disk drive comprises a base 10 to which are secured a disk drive motor 12 and an actuator 14, and a cover 11. The base 10 and cover 11 provide a substantially sealed housing for the disk drive. Typically, there is a gasket 13 located between base 10 and cover 11 and a small breather port (not shown) for equalizing pressure between the interior of the disk drive and the outside environment. A magnetic recording disk 16 is connected to drive motor 12 by means of hub 18 to which it is attached for rotation by the drive motor 12. A thin continuous lubricant film 50 is maintained on the surface of disk 16. A read/write head or transducer 25 is formed on the trailing end of a carrier, such as an air-bearing slider 20. Transducer 25 may be an inductive read and write transducer or an inductive write transducer with a magnetoresistive (MR) read transducer of the type to be described. The slider 20 is connected to the actuator 14 by means of a rigid arm 22 and a suspension 24. The suspension 24 provides a biasing force that urges the slider 20 onto the surface of the recording disk 16. During operation of the disk drive, the drive motor 12 rotates the disk 16 at a constant speed and the actuator 14, which is typically a linear or rotary voice coil motor (VCM), moves the slider 20 generally radially across the surface of the disk 16 so that the read/write head 25 may access different data tracks on disk 16.

Figure 2:
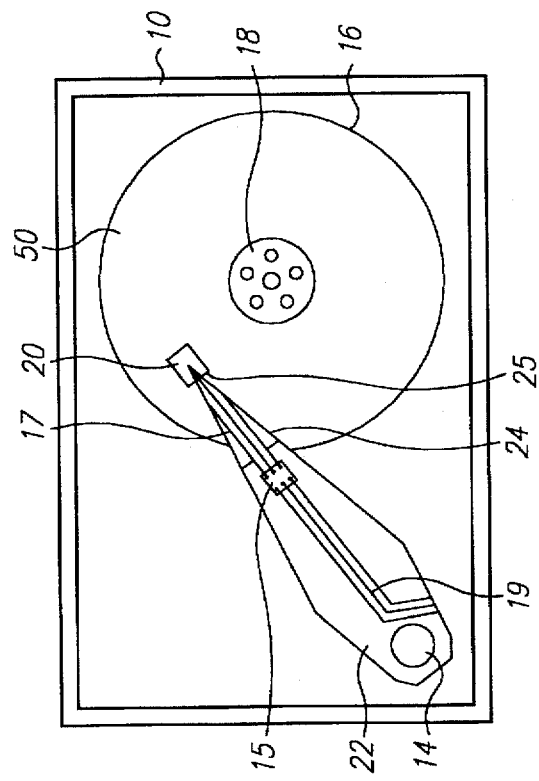
FIG. 2 is a top view of the disk drive of FIG. 1 with the cover removed.

FIG. 2 is a top view of the interior of the disk drive with the cover 11 removed, and illustrates in better detail the suspension 24 that provides a force to the slider 20 to urge it toward the disk 16. The suspension may be a conventional type of suspension, such as the well-known Watrous suspension, as described in assignee's U.S. Pat. No. 4,167, 765. This type of suspension also provides a gimbaled attachment of the slider which allows the slider to pitch and roll as it rides on the air bearing. The data detected from disk 16 by the head 25 is processed into a data readback signal by signal amplification and processing circuitry in the integrated circuit chip 15 located on arm 22. The signals from head 25 travel via flex cable 17 to chip 15, which sends its output signals via cable 19.

The above description of a typical magnetic disk storage system, and the accompanying FIGS. 1 and 2, are for representation purposes only. Disk storage systems may contain a large number of disks and actuators, and each actuator may support a number of sliders. In addition, instead of an air-bearing slider, the head carrier may be one which maintains the head in contact or near contact with the disk, such as in liquid bearing and other contact recording disk drives.

Figure 3:
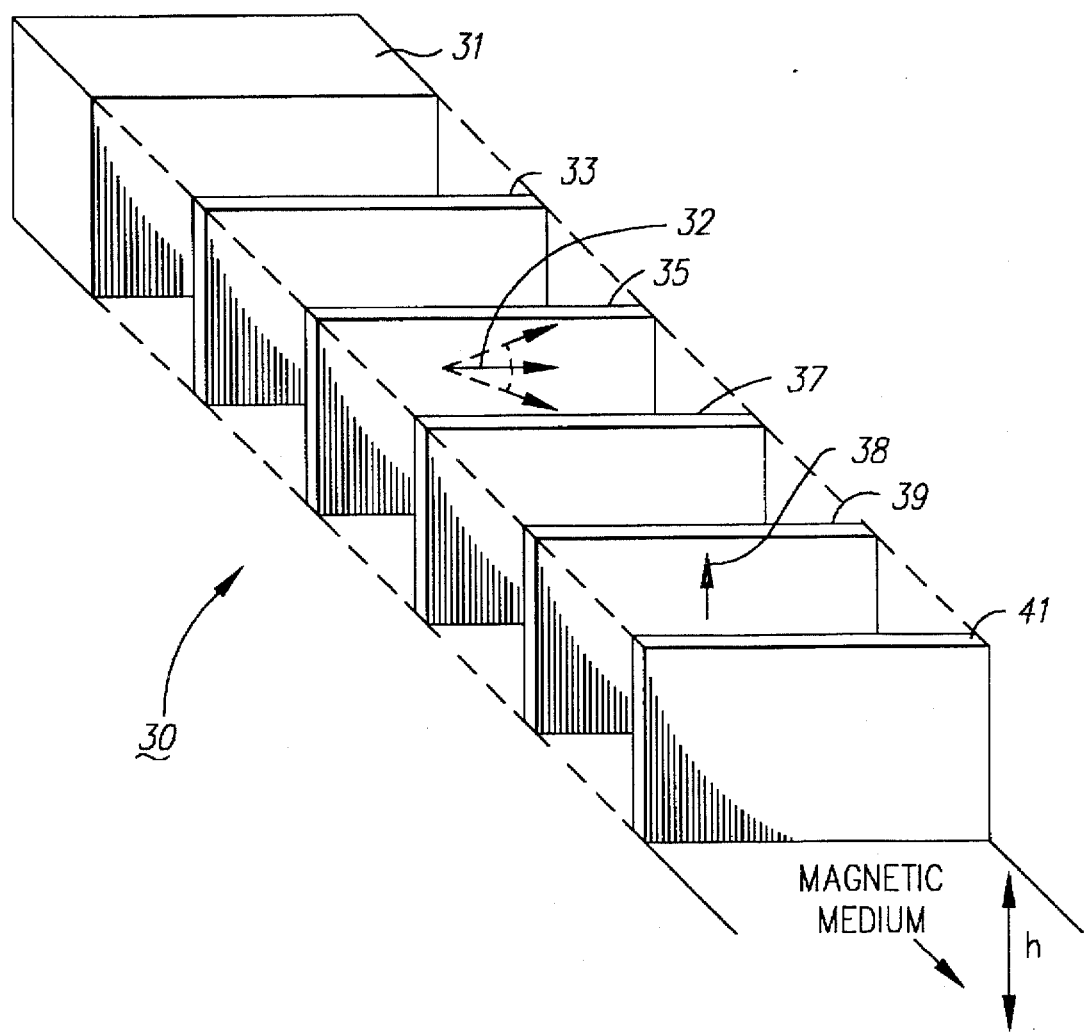
FIG. 3 is an exploded perspective view of a prior art SVMR sensor.

Referring now to FIG. 3, a prior art SVMR sensor 30 comprises a suitable substrate 31 such as glass, ceramic, or a semiconductor, for example, upon which is deposited a seed or buffer layer 33, a first thin layer 35 of soft ferromagnetic material, a thin nonferromagnetic metallic spacer layer 37, and a second thin layer 39 of ferromagnetic material. The MR sensor 30 may form part of transducer 25 in the disk drive system of FIGS. 1 and 2, and the substrate 31 may be the trailing end of the head carrier or slider 20. In the absence of an externally applied magnetic field from the recorded magnetic medium, the magnetizations of the two layers 35, 39 of ferromagnetic material are oriented at an angle, preferably of about 90 degrees, with respect to each other as indicated by arrows 32 and 38, respectively. The ferromagnetic layer 35 is called the "free" ferromegnetic layer in that its magnetization is free to rotate its direction in response to an externally applied magnetic field (such as magnetic field h from the magnetic medium, as shown in FIG. 3), as shown by the dashed arrows on layer 35. The ferromagnetic layer 39 is called the "pinned" ferromagnetic layer because its magnetization direction is fixed or pinned in a preferred orientation, as shown by arrow 38. A thin film layer 41 of an exchange biasing antiferromagnetic material having relatively high electrical resistance is deposited in direct contact with the ferromagnetic layer 39 to provide a biasing field by exchange coupling. Layer 41 thus pins the magnetization of the ferromagnetic layer in a preferred direction so that it cannot rotate its direction in the presence of an applied external magnetic field having a strength in the range of the signal field. The exchange bias layer 41 is typically iron-manganese (Fe—Mn). This material has relatively poor corrosion resistance. However, because the pinned layer typically has a net magnetic moment equivalent to approximately 30–100 Å of Ni—Fe, this material provides the desired level of exchange coupling to fix the magnetization direction of the pinned layer.

Figure 4:
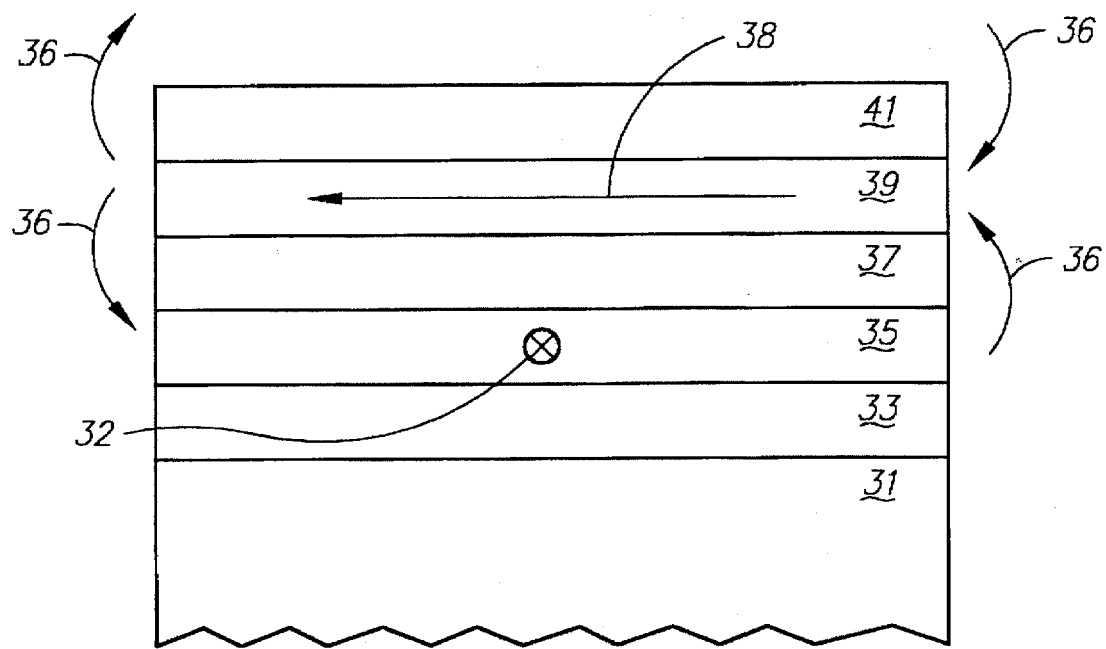
FIG. 4 is a sectional view of the SVMR sensor of FIG. 3, but rotated 90 degrees.

FIG. 4 is a sectional view of the structure of FIG. 3, but rotated 90 degrees so that the direction of magnetization of pinned layer 39 is in the plane of the paper as shown by arrow 38. The pinned ferromagnetic layer 39 has a net macroscopic magnetic moment, represented by arrow 38. The magnetic field (shown by flux lines 36) associated with this magnetic moment has an effect on the free ferromagnetic layer 35, which has its direction of magnetization (arrow 32 into the paper) formed at an angle of approximately 90 degrees to that of the pinned layer. This field from the pinned layer 39 causes the magnetization in the free layer 35 to be nonuniform. Because the free layer 35 is relatively short in the SVMR sensor, nonuniformity of the magnetization can cause portions of the sensor to saturate prematurely in the presence of an externally applied signal field from the magnetic medium. The SVMR sensor is the typical spin valve structure in that the free layer 35 is on the bottom or adjacent the sensor substrate.

Preferred Embodiments

In the SVMR sensor of the present invention, the conventional single-layer pinned ferromagnetic layer is replaced by a laminated structure comprising at least two ferromagnetic films separated by a thin nonferromagnetic film that provides antiparallel coupling (APC) of the two ferromagnetic films. This laminated antiparallel (AP) pinned layer is described in U.S. Pat. No. 5,465,185. The antiparallel coupling (APC) film is of the appropriate type and thickness to allow the two ferromagnetic films to be antiferromagnetically coupled to one another, and in the preferred embodiment is approximately 2–8 Å ruthenium (Ru). This laminated pinned layer is then located on the bottom of the SVMR sensor near the substrate, and the antiferromagnetic (AF) layer for pinning the laminated pinned layer is selected from a group of antiferromagnetic materials having relatively high corrosion resistance. The AF layer may be of a material having a relatively low exchange anisotropy that would otherwise render it unsuitable for use in conventional SVMR sensors.

Figure 5:
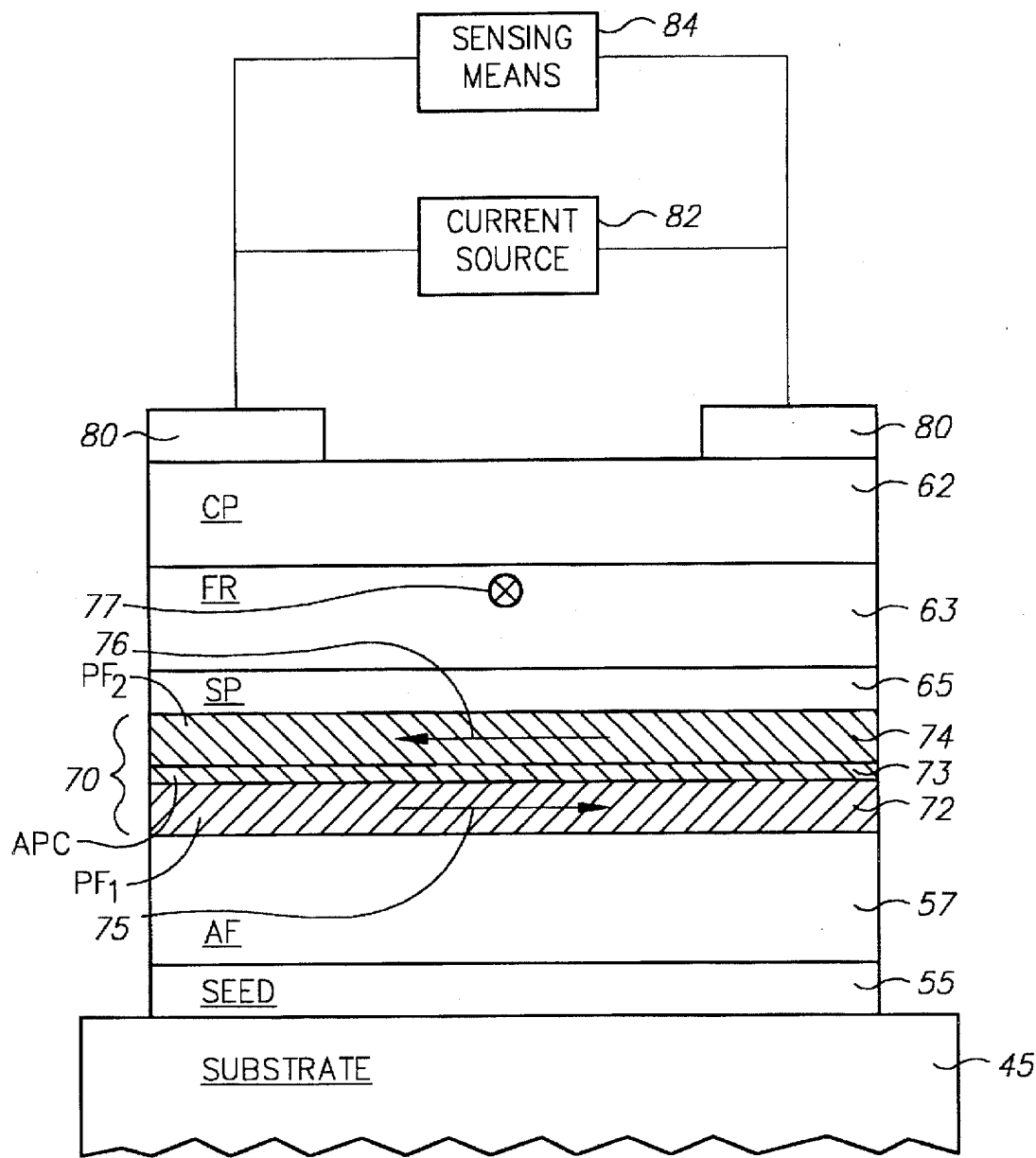
FIG. 5 is a sectional view of the SVMR sensor according to the present invention.

The SVMR sensor, as shown in FIG. 5, has a general structure according to the following: Substrate/Seed/AF/ $PF_1/APC/PF_2/SP/FR/CP$. The substrate 45 can be any suitable substance, including glass, semiconductor material, or a ceramic material, such as alumina ($Al_2O_3$). The seed layer 55 is any layer deposited to modify the crystallographic texture or grain size of the subsequent layers, and may not be needed depending on the substrate. If used, the seed layer may be formed of tantalum (Ta), zirconium (Zr), nickel-iron (Ni—Fe), or $Al_2O_3$. The antiferromagnetic (AF) layer 57 is preferably nickel-oxide (NiO). The NiO AF layer 57 is deposited onto seed layer 55 by any conventional method, such as sputtering a NiO target or sputtering a Ni target in the presence of an oxygen-containing gas, to the thickness at which the desired exchange properties are achieved, typically 200–500 Å. The $PF_1/APC/PF_2$ laminated pinned layer 70 is formed on AF layer 57. The two ferromagnetic layers 72, 74 ($PF_1$ and $PF_2$) are preferably formed of Co, have equal or nearly equal magnetic moment and are separated by an antiparallel coupling (APC) film 73 of nonmagnetic material that allows $PF_1$ and $PF_2$ to be strongly coupled together antiferromagnetically. The two Co films 72, 74 in the laminated AP-pinned layer 70 have their magnetization directions oriented antiparallel, as indicated by arrows 75, 76. The antiparallel alignment of the magnetizations of the two films 72, 74 is due to an antiferromagnetic exchange coupling through the APC film 73. Because of this antiferromagnetic coupling, and because the two Co films 72, 74 have substantially the same thickness, the magnetic moments of each of the films nearly cancel each other so that there is very little or essentially no net magnetic moment in the laminated AP-pinned layer 70. This results in an amplification of the exchange field above that which would be present if only layer 72 were used as a single pinned layer pinned by AF layer 57.

To complete the SVMR sensor a metallic spacer layer 65 (SP) is formed on the second ferromagnetic film 74, the free ferromagnetic layer 63 (FR) is formed on the spacer layer 65, and a capping layer 62 (CP) is formed on free ferromagnetic layer 63. In the absence of an applied field, the free ferromagnetic layer 63 has its magnetization axis oriented in the direction shown by arrow 77, i.e., generally perpendicular to the magnetization axes 75, 76 of the pinned films 72, 74.

The AF layer 57 may be any relatively high corrosion resistant antiferromagnetic material. However, it must provide sufficient exchange energy for the laminated pinned layer 70 such that the ascending or descending magnetization loop (M-H loop) of the $AF/PF_1/APC/PF_2$ structure is generally flat for at least an applied field range of approximately ±200 Oe centered around zero. When that criterion is met there is little or no rotation of the magnetization of $PF_1$ or $PF_2$ and thus no adverse effect on the magnetoresistance of the SVMR sensor at low field levels. When using an AF layer 57 with exchange energy less than that of Fe—Mn, this criterion is achieved by using the laminated AP-pinned layer shown in FIG. 5.

The SVMR sensor with the NiO based AP-pinned layer was fabricated in the following manner. A 420 Å NiO AF layer was deposited on a clean glass substrate by RF magnetron sputtering from a NiO target. (The use of a Ni target in the presence of a reactive gas that includes oxygen will also yield a sputter deposited NiO layer). No seed layer was used on the glass substrate. The NiO layer was deposited in the presence of a magnetic field of several hundred Oe, but an applied field during deposition is not necessary. After deposition of the NiO layer, the sample was removed from the NiO deposition system and transported in air to a second deposition system. The sample was introduced to the second deposition system and etched with 500 eV argon (Ar) ions for 100 seconds using a conventional ion beam source. This cleaned the NiO surface and resulted in the removal of about 10 Å of surface material. After etching the laminated Co/Ru/Co AP-pinned layer and the remaining films were deposited by DC magnetron sputtering while the sample was in an applied magnetic field. After deposition the NiO AF layer will likely not be in a single antiferromagnetic domain state, and as a result the Co/Ru/Co pinned layer may not be in a single ferromagnetic domain state, resulting in reduced magnetoresistance amplitude. Therefore, after deposition of the films the sample was heated to above the NiO antiferromagnetic blocking temperature (about 180 deg C.) in a field of 15 kOe. This large field is sufficient to rotate the magnetization of the two Co layers of the Co/Ru/Co pinned layer against the effect of the Ru, so that both of their magnetizations are parallel to the applied magnetic field, and both Co layers are in a single domain state. The sample was then cooled with the applied field still present, so that the single domain state of the NiO/Co portion (the NiO AF layer and the adjacent first ferromagnetic film) of the pinned layer is maintained. After cooling to room temperature the applied field is removed, and the magnetization of the second Co film of the pinned layer rotates to be antiparallel to that of the Co film in contact with NiO AF layer, due to the influence of the Ru. This aligns the direction of the exchange anisotropy and places the pinned layer in an essentially single domain state, yielding the largest magnetoresistance.

Figure 6:
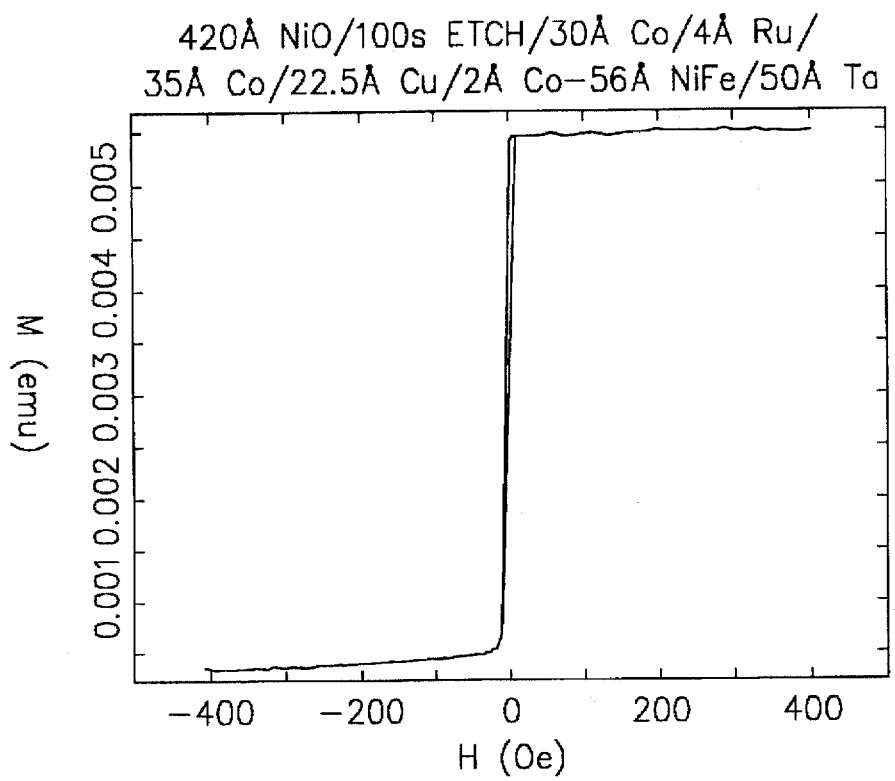
FIG. 6 is the M-H loop of a SVMR sensor using an NiO-based laminated AP-pinned structure (NiO/Co/Ru/Co) over a 400 Oe magnetic field excursion showing little rotation of the laminated AP-pinned layer.

FIG. 6 shows the M-H loop of a SVMR sensor with a laminated AP-pinned layer with 4 Å of Ru as the APC film and with NiO as the AF layer. The SVMR sensor whose data is shown in FIG. 6 had the structure shown in FIG. 5 and comprised a glass substrate 45, a 420 Å NiO layer 57 (AF) deposited directly on the glass substrate 45 without a seed layer, a first pinned ferromagnetic film 72 ($PF_1$) of 30 Å cobalt (Co), a 4 Å Ru film 73 (APC), a second pinned ferromagnetic film 74 ($PF_2$) of 35 Å Co, a 22.5 Å copper (Cu) spacer layer 65 (SP), a free ferromagnetic layer 63 (FR) made up of 2 Å Co and 56 Å Ni—Fe, and a 50 Å tantalum (Ta) capping layer 62 (CP). Because the NiO layer 57 was deposited in a separate chamber from the remaining films, the NiO layer 57 was etched by an ion beam for approximately 100 seconds to clean its surface prior to the deposition of the $PF_1$ film. In FIG. 6 the large magnetization change at zero applied field is the reversal of the magnetization direction of the free layer 63. At applied field levels away from zero, over a field excursion of approximately ±400 Oe, the magnetization is essentially flat, which indicates that there is little rotation of the laminated AP-pinned layer 70.

Figure 7:
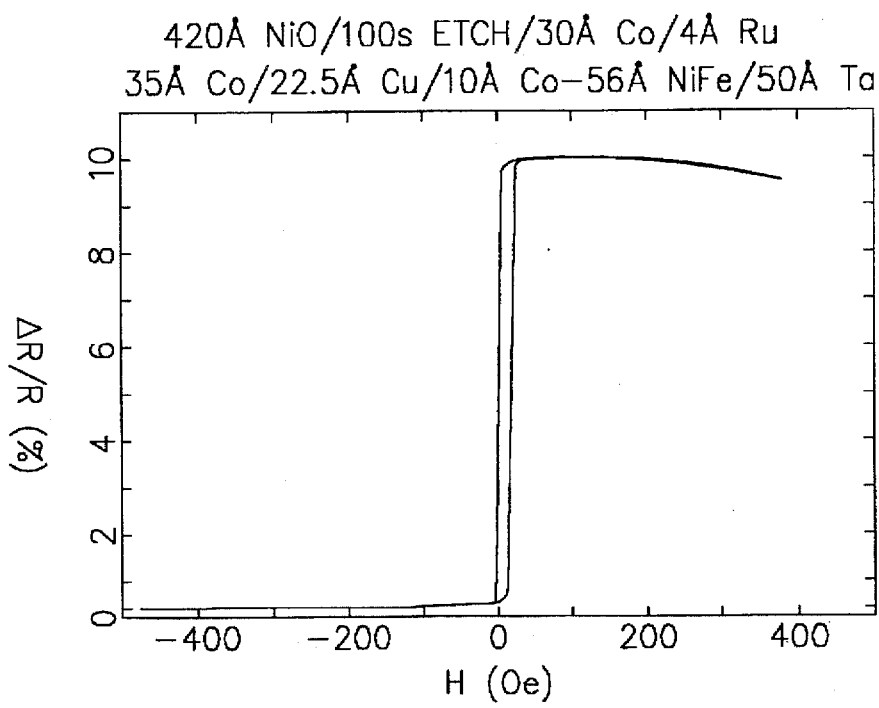
FIG. 7 is a graph of the magnetoresistance versus applied magnetic field of a SVMR sensor using an NiO-based laminated AP-pinned structure (NiO/Co/Ru/Co) over a 400 Oe magnetic field excursion showing only a slight reduction in magnetoresistance amplitude at the highest fields.

FIG. 7 shows the MR response of a SVMR sensor with a NiO based laminated AP-pinned layer. This SVMR sensor was identical to the sensor whose MR response is shown in FIG. 7 with the exception that the free layer 63 was made up of 10 Å Co/56 Å Ni—Fe instead of 2 Å Co/56 Å Ni—Fe. FIG. 7 shows only a small amount of rotation of the pinned layer, represented by the small drop in deltaR/R, as the applied field approaches +400 Oe. In the embodiments whose data is shown for FIGS. 6 and 7, the net magnetic moment of the $PF_1$/APC/$PF_2$ laminated pinned layer was equivalent to only approximately 10 Å of $Ni_{80}Fe_{20}$.

Figure 8:
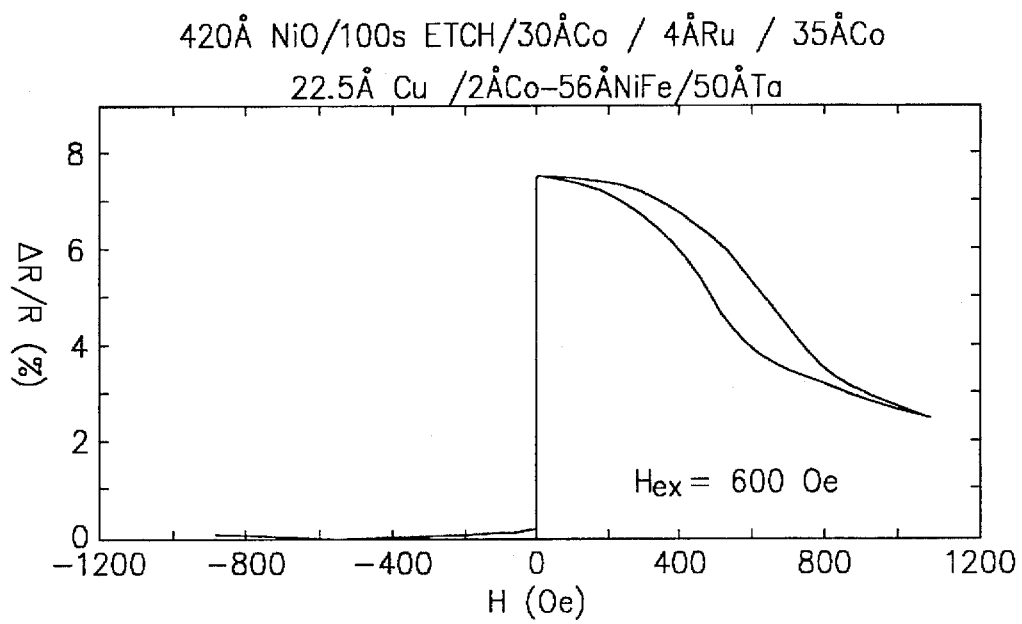
FIG. 8 is a graph of the magnetoresistance versus applied magnetic field of a SVMR sensor using an NiO-based laminated AP-pinned structure (NiO/Co/Ru/Co) over a field excursion of 1000 Oe showing that the exchange field is 600 Oe, substantially larger than in conventional SVMR sensors.
Figure 9:
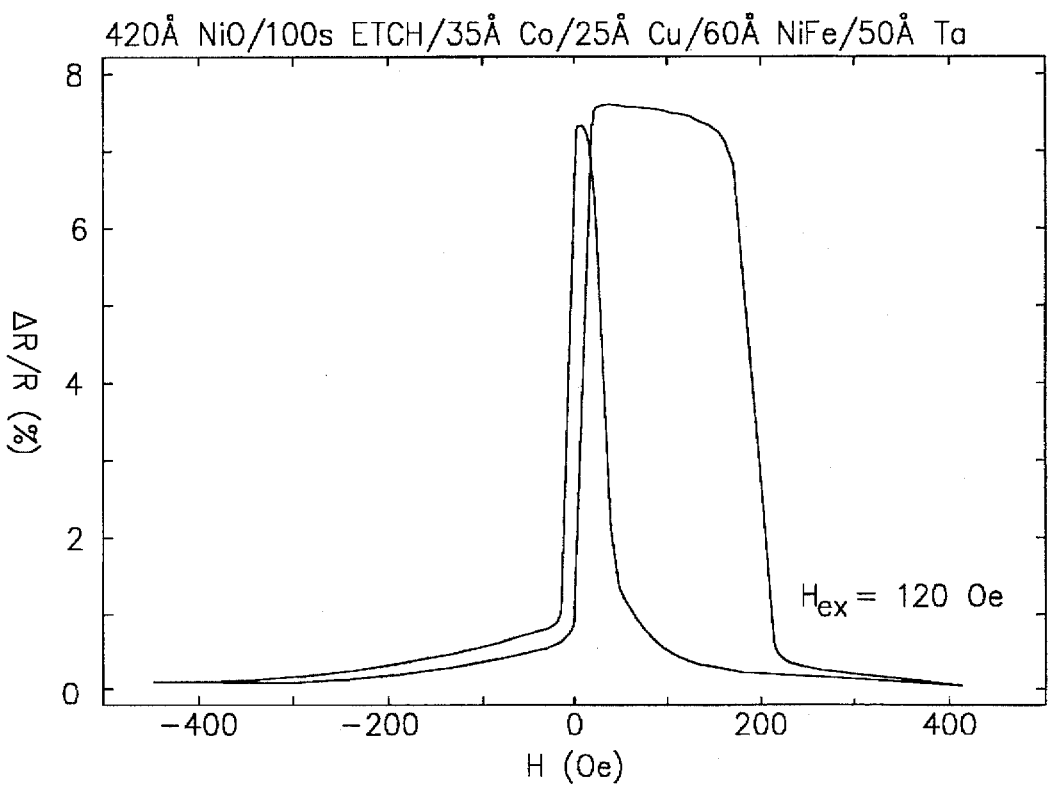
FIG. 9 is a graph of the magnetoresistance versus applied magnetic field of a SVMR sensor using a NiO-based single layer pinned structure (NiO/Co) over a field excursion of 1200 Oe showing a low exchange field of about 100 Oe.

FIG. 8 shows the magnetoresistance of the NiO-based laminated AP-pinned SVMR sensor with the same structure as described for FIG. 6 over a field excursion of ±1000 Oe. With a layer of 420 Å NiO as the AF layer the exchange anisotropy energy was approximately 0.02 erg/cm$^2$, so that exchange field $H_{ex}$ of about 600 Oe was obtained, as shown in FIG. 8. FIG. 8 shows that even at such high fields, this SVMR sensor's response is dominated by reversible rotation of the laminated AP-pinned layer, so that the magnetoresistance is unchanged when the film is subjected to such high fields. Thus, the SVMR sensor with the NiO-based laminated AP-pinned layer greatly exceeds the level of desired stability against high fields. In contrast to this response, FIG. 9 shows that this criterion is clearly violated if the NiO AF layer is used with a conventional single-layer pinned layer. The SVMR sensor whose MR response is shown in FIG. 9 had a single 35 Angstrom Co layer as the pinned layer pinned by a 420 Å NiO AF layer. FIG. 9 shows that the exchange field is only about 120 Oe and that the pinned layer begins to rotate within an applied field of only about 200 Oe.

Referring again to FIG. 5, the means for connecting the SVMR sensor to sensing circuitry in the magnetic recording system is illustrated schematically. Electrical leads 80 are provided to form a circuit path between the SVMR sensor, a current source 82, and a sensing means 84. As is well known in the art, additional sensor elements, such as transverse and longitudinal bias layers (not shown), may be required to provide an optimal SVMR sensor response circuit. In the preferred embodiment, a magnetic signal in the medium is sensed by the sensing means 84 detecting the change in resistance, deltaR, as the magnetization of the free ferromagnetic layer 63 rotates in response to the applied magnetic signal from the recorded medium.

While in the embodiment shown in FIG. 5, the laminated AP-pinned layer 70 comprises two ferromagnetic films 72, 74 separated by a single APC film 73, the laminated AP-pinned layer 70 may comprise a multiple number of ferromagnetic films separated by APC films. Depending on the materials selected for the ferromagnetic films 72, 74 and APC film 73 in the laminated AP-pinned layer 70, there is a preferred APC film thickness at which the ferromagnetic films 72, 74 become strongly antiferromagnetically coupled. For the case of the preferred Co/Ru combination, the thickness of the Ru AF coupling film can be selected to be between 2–8 Å. The oscillatory coupling relationship for selected material combinations is described in detail by Parkin et al. in *Phys. Rev. Lett.*, Vol. 64, p. 2034 (1990). While the laminated AP-pinned layer in the SVMR sensor has been shown with the preferred materials of Co and Ru as the ferromagnetic and APC films, respectively, other ferromagnetic materials (such as Co, Fe, Ni, and their alloys, such as Ni—Fe, Ni—Co, and Fe—Co) with other APC films (such as chromium (Cr), rhodium (Rh), iridium (Ir), Cu, and their alloys) are possible. For each such material combination, the oscillatory exchange coupling relationship would have to be determined, if not already known, so that the thickness of the APC film is selected to assure antiferromagnetic coupling between the two ferromagnetic films.

If the thicknesses of the two ferromagnetic films 72, 74 forming the laminated AP-pinned layer 70 are identical, then in theory the net moment of the pinned layer 70 would be zero because each of the magnetic moments would precisely cancel. Because it is not possible to precisely form each of the films to the exact same thickness, the net moment of the laminated AP-pinned layer 70 will likely be a small but nonzero value as a natural result of the normal deposition process. However, it may be desirable to deliberately deposit one of the pinned ferromagnetic films 72, 74 to a thickness slightly greater than that of the other film so that there would be a small nonzero net magnetic moment in the pinned layer. This would assure that the magnetization of the laminated AP-pinned layer 70 is stable in the presence of magnetic fields so that the direction of its magnetization is predictable.

The free ferromagnetic layer 63 may also include a thin Co film adjacent to the spacer layer 65. While this is not shown in FIG. 5, it is part of the preferred embodiment as described with respect to the data shown in FIGS. 6–8. These Co films increase the magnetoresistance of the SVMR sensor but are maintained relatively thin, in the range of 2–20 Å, to minimize the effect of the relatively "hard" magnetic Co material on the permeability of the sensor and to maintain the proper free layer moment.

The high corrosion-resistant, low exchange anisotropy AF material used to pin the laminated AP-pinned layer provides an additional advantage in SVMR sensors in that it can also serve as the gap material in the MR read gap. Referring again to FIG. 5, in the fabrication of the complete SVMR structure, such as an integrated read/write head that includes a SVMR read element and an inductive write element, the SVMR sensor layers shown in FIG. 5 would be located between a pair of MR shields, that are typically formed of $Ni_{80}Fe_{20}$ or sendust (a magnetic alloy of Fe, Si, and Al). Electrically insulative gap material is then located between the shields. However, in the present invention the NiO AF layer 57 provides an additional advantage in that, because it is an excellent insulator, it can also serve as the gap material. In this case the first MR shield functions as the substrate 45.

Figure 10:
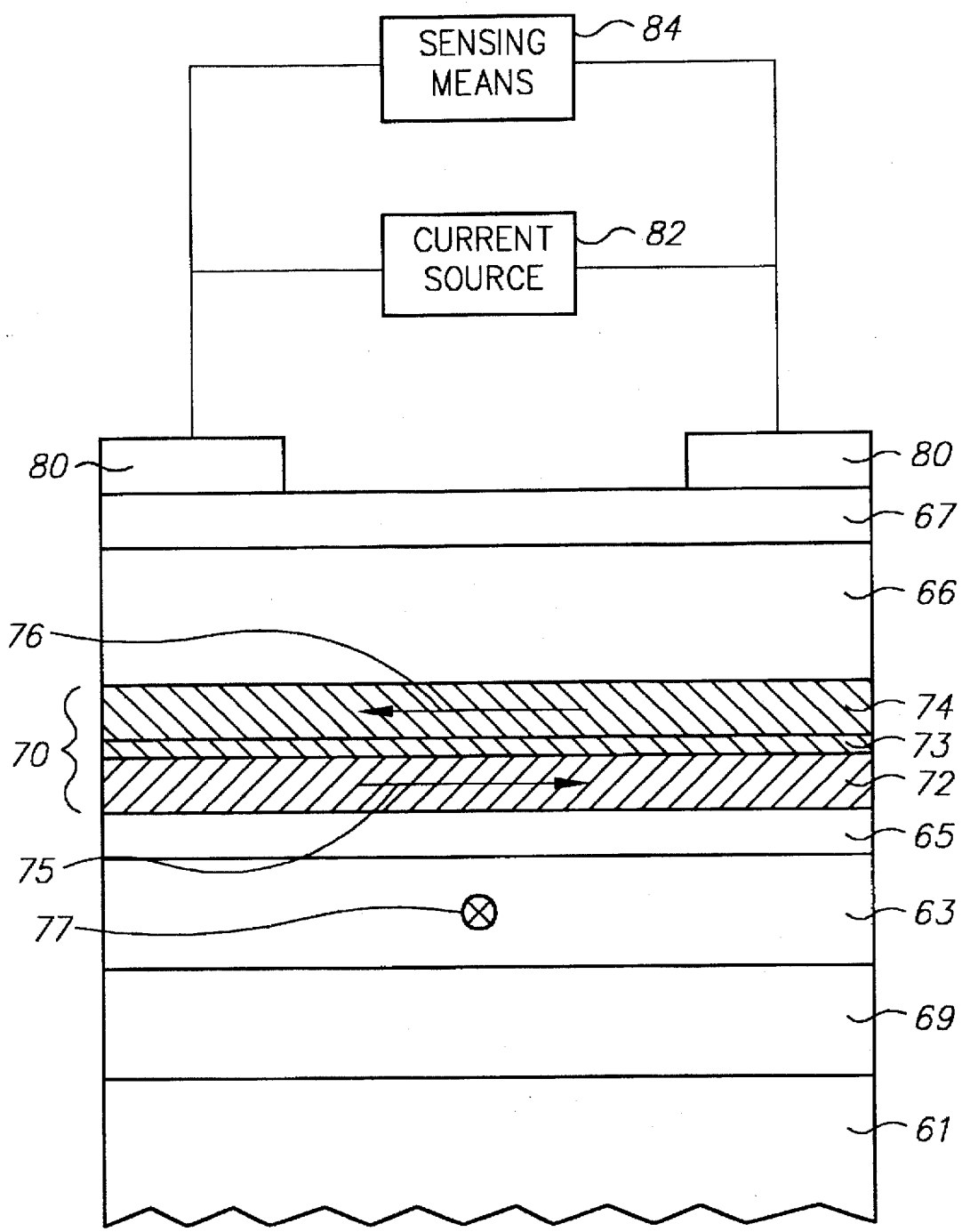
FIG. 10 shows the SVMR sensor embodiment of the present invention where the NiO-based laminated AP-pinned layer is located on top.

FIG. 10 shows an alternative embodiment similar to that of FIG. 5 but wherein the free layer 63 (FR) is formed on seed layer 69 which is formed on substrate 61, and is thus located on the bottom of the SVMR and the AP-pinned layer 70 is on the top of the SVMR sensor. The AF layer 66 is deposited on the second pinned ferromagnetic film 74 ($PF_2$). A capping layer 67 (like capping layer 62 in FIG. 5) is formed over AF layer 66. This structure can also be used with low exchange anisotropy antiferromagnets.

Figure 11:
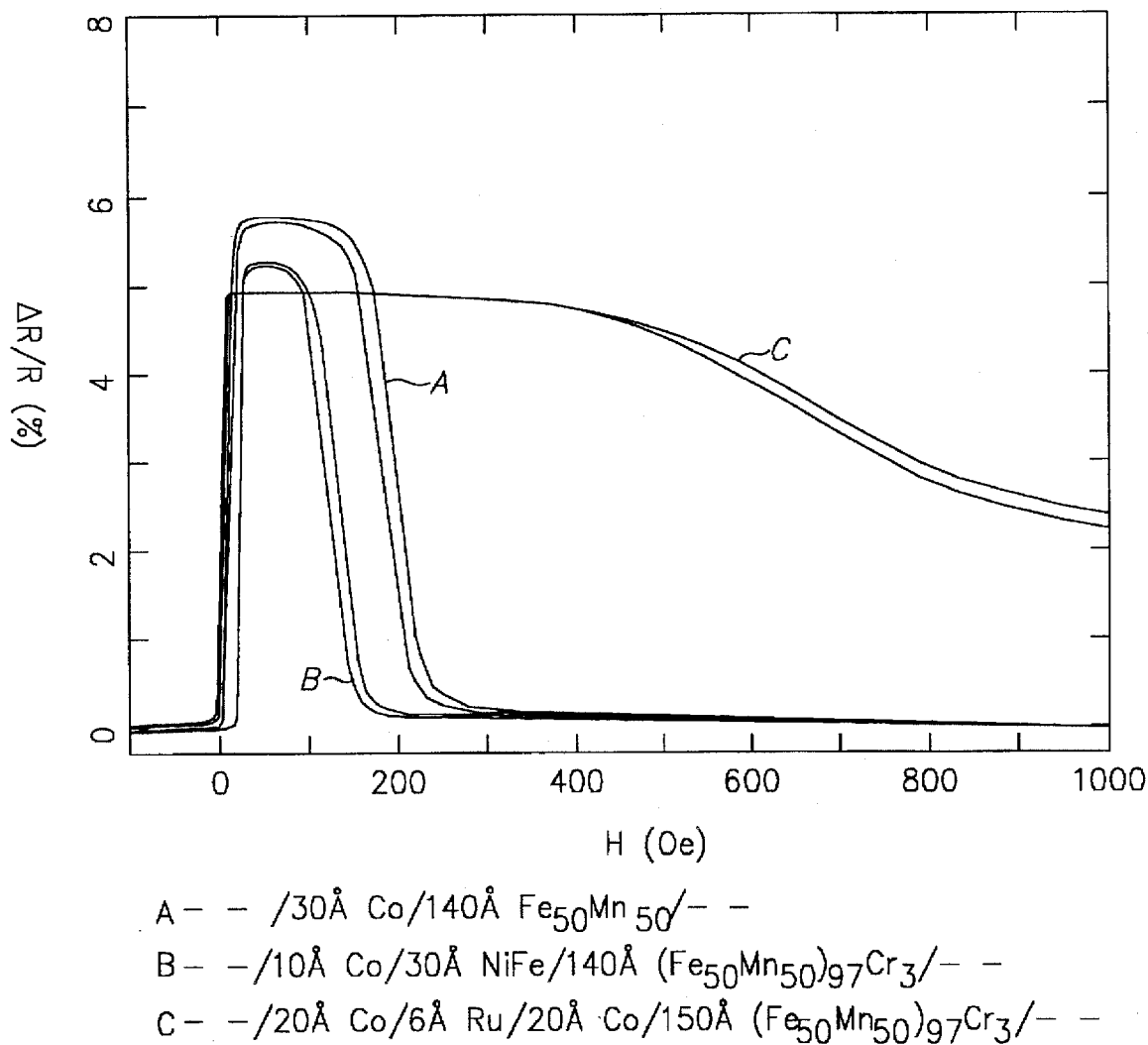
FIG. 11 is a graph of magnetoresistance versus applied magnetic field for (A) a SVMR sensor with a conventional single Co layer pinned by a $Fe_{50}Mn_{50}$ layer, (B) a SVMR sensor with a conventional Co/Ni—Fe pinned layer pinned by a $(Fe_{50}Mn_{50})_{97}Cr_3$ layer, and (C) a SVMR sensor with a laminated AP-pinned layer (Co/Ru/Co) pinned with a $(Fe_{50}Mn_{50})_{97}Cr_3$ layer.

FIG. 11 shows the magnetoresistance versus applied field for the SVMR sensor embodiment shown in FIG. 10, as compared to other SVMR sensors, but wherein the corrosion resistant AF layer is an alloy of Fe—Mn and chromium (Cr), e.g., $(Fe_{50}Mn_{20})_{97}Cr_3$, instead of NiO. Curve A in FIG. 11 is for a SVMR sensor with a conventional single layer pinned layer using $Fe_{50}Mn_{50}$ as the antiferromagnet and shows an exchange field of about 220 Oe. Curve B is for a SVMR sensor with a conventional pinned layer using $(Fe_{50}Mn_{50})_{97}Cr_3$ as the antiferromagnet and shows an exchange field of about 160 Oe. While $(Fe_{50}Mn_{50})_{97}Cr_3$ is known to provide more corrosion resistance than Fe—Mn, curve B clearly shows it is undesirable in conventional SVMR sensors because of the significant reduction in exchange field. Curve C is for a SVMR sensor according to the present invention using a laminated AP-pinned layer of Co/Ru/Co with $(Fe_{50}Mn_{50})Cr_3$ and shows an exchange field of about 900 Oe. The $(Fe_{50}Mn_{50})_{97}Cr_3$ provides a significant improvement in corrosion resistance for the SVMR sensor. The amount of Cr is chosen to provide the desired 3mount of corrosion resistance and is typically between approximately 2–5%.

In addition to NiO and $(Fe_{50}Mn_{50})Cr_3$ as the AF layers for use with the laminated AP-pinned layer in SVMR sensors, another material that would otherwise be unusable as an AF material in SVMR sensors, but that will provide the necessary corrosion resistance and sufficient exchange anisotropy is $(Ni_{1-x}Co_x)O$, where x is between approximately 0 and 0.5.

While the present invention has been particularly shown and described with reference to the preferred embodiments, it will be understood by those skilled in the art that various changes in form and detail may be made without departing from the spirit, scope, and teaching of the invention. Accordingly, the disclosed invention is to be considered merely as illustrative and limited in scope only as specified in the appended claims.

What is claimed is:

1. An inverted spin valve magnetoresistive sensor comprising:

a substrate;

an exchange bias layer of antiferromagnetic material selected from the group consisting of nickel-oxide, $(Ni_{1-x}Co_x)O$ where x is between 0.0 and 0.5, and an alloy of (Fe—Mn) and Cr, the exchange bias layer formed directly on and in contact with the substrate;

a laminated antiparallel pinned layer adjacent to the exchange bias layer, the laminated antiparallel pinned layer comprising a first ferromagnetic film formed directly on, in contact with and antiferromagnetically coupled to the exchange bias layer, a second ferromagnetic film, and a nonmagnetic antiparallel coupling film between and in contact with the first and second ferromagnetic films for coupling the first and second ferromagnetic films together antiferromagnetically so that their megnetizations are aligned antiparallel with one another, the magnetizations of the first and second ferromagnetic films remaining antiparallel and pinned by the exchange bias layer in the presence of an applied magnetic field;

a nonmagnetic spacer layer adjacent to the second ferromagnetic film of the laminated antiparallel pinned layer; and a free ferromagnetic layer adjacent to and in contact with the spacer layer and having a preferred axis of magnetization in the absence of an applied magnetic field that is generally perpendicular to the magnetization axis of the first and second ferromagnetic films in the laminated antiparallel pinned layer.

2. A spin valve magnetoresistive sensor as in claim 1 wherein the substrate is a magnetoresistive shield.

3. A spin valve magnetoresistive sensor as in claim 1 wherein the exchange bias layer consists essentially of nickel-oxide.

4. A spin valve magnetoresistive sensor as in claim 1 wherein the nonmagnetic antiparallel coupling film consists essentially of Ru.

5. A spin valve magnetoresistive sensor as in claim 1 wherein the Ru film has a thickness in the range of approximately 2–8 Angstroms.

6. A spin valve magnetoresistive sensor as in claim 1 wherein the first and second ferromagnetic films in the laminated antiparallel pinned layer are made of a material selected from the group consisting of Co, Fe, Ni, and their alloys, and wherein the nonmagnetic antiparallel coupling film in the laminated antiparallel pinned layer is made of a material selected from the group consisting of Ru, Cr, rhodium (Rh), iridium (Ir), and their alloys.

7. A spin valve magnetoresistive sensor as in claim 6 wherein the first and second ferromagnetic films in the laminated antiparallel pinned layer consist essentially of cobalt.

8. A spin valve magnetoresistive sensor as in claim 1 wherein the laminated antiparallel pinned layer has essentially zero net magnetic moment.

9. A spin valve magnetoresistive sensor as in claim 1 wherein the first and second films in the laminated antiparallel pinned layer have substantially the same thickness.

10. A magnetic recording disk drive comprising:

a magnetic recording disk;

a motor connected to the disk for rotating the disk;

a carrier for supporting a spin valve magnetoresistive sensor and providing a substrate for attachment of the sensor;

the spin valve magnetoresistive sensor formed on the carrier substrate for sensing magnetically recorded data on the disk, the sensor comprising:

an exchange bias layer of antiferromagnetic material selected from the group consisting of nickel-oxide, $(Ni_{1-x}Co_x)O$ where x is between 0.0 and 0.5, and an alloy of (Fe—Mn) and Cr, the exchange bias layer being formed directly on and in contact with the carrier substrate;

a laminated antiparallel pinned layer adjacent to the exchange bias layer, the laminated antiparallel pinned layer comprising a first ferromagnetic film formed directly on, in contact with and antiferromagnetically coupled to the exchange bias layer, a second ferromagnetic film, and a nonmagnetic antiparallel coupling film between and in contact with the first and second ferromagnetic films for coupling the first and second ferromagnetic films together antiferromagnetically so that their magnetizations are aligned antiparallel with one another, the magnetizations of the first and second ferromagnetic films remaining antiparallel and pinned by the exchange bias layer in the presence of an applied magnetic field;

a nonmagnetic spacer layer adjacent to the second ferromagnetic film of the laminated antiparallel pinnel layer; and a free ferromagnetic layer adjacent to and in contact with the spacer layer;

an actuator for moving the carrier generally radially across the disk so the sensor memory access different regions of magnetically recorded data on the disk;

means connecting the carrier to the actuator for maintaining the carrier near the disk;

means electrically coupled to the sensor for detecting changes in resistance of the sensor caused by rotation of the magnetization axis of the free ferromagnetic layer relative to the fixed magnetizations of the antiparallel coupled first and second ferromagnetic films in the laminated antiparallel pinned layer in response to magnetic fields from the magnetically recorded disk; and means for supporting the motor and actuator.

11. A disk drive as in claim 10 wherein the substrate is a magnetoresistive shield.

12. A disk drive as in claim 10 wherein the exchange bias layer consists essentially of nickel-oxide.

13. A disk drive as in claim 10 wherein the nonmagnetic antiparallel coupling film consists essentially of Ru.

14. A disk drive as in claim 13 wherein the Ru film has a thickness in the range of approximately 2–8 Angstroms.

15. A disk drive as in claim 10 wherein the first and second ferromagnetic films in the laminated antiparallel pinned layer are made of a material selected from the group consisting of Co, Fe, Ni, and their alloys, and wherein the nonmagnetic antiparallel coupling film in the laminated antiparallel pinned layer is made of a material selected from the group consisting of Ru, Cr, rhodium (Rh), iridium (Ir), and their alloys.

16. A disk drive as in claim 15 wherein the first and second ferromagnetic films in the laminated antiparallel pinned layer consist essentially of cobalt.

17. A disk drive as in claim 10 wherein the laminated antiparallel pinned layer has essentially zero net magnetic moment.

18. A disk drive as in claim 10 wherein the first and second films in the laminated antiparallel pinned layer have substantially the same thickness.

19. A spin valve magnetoresistive sensor of the inverted type having two uncoupled ferromagnetic layers separated by a nonmagnetic metallic layer in which the magnetization of one of the ferromagnetic layers is pinned by an antiferromagnetic layer that is formed directly on and in contact with a substrate supporting the sensor, the inverted spin valve sensor comprising:

a substrate;

a seed layer formed on the substrate;

an exchange bias layer of antiferromagnetic material selected from the group consisting of nickel-oxide, $(Ni_{1-x}Co_x)O$ where x is between 0.0 and 0.5, and an alloy of(Fe—Mn) and Cr, the exchange bias layer formed directly on and in contact with the seed layer;

a laminated antiparallel pinned layer adjacent to the exchange bias layer, the laminated antiparallel pinned layer comprising a first ferromagnetic film formed directly on, in contact with, and antiferromagnetically coupled to the exchange bias layer, a second ferromagnetic film, and a nonmagnetic antiparallel coupling film between and in contact with the first and second ferromagnetic films for coupling the first and second ferromagnetic films together antiferromagnetically so that their magnetizations are aligned antiparallel with one another, the magnetizations of the first and second ferromagnetic films remaining antiparallel and pinned by the exchange bias layer in the presence of an applied magnetic field;

a nonmagnetic spacer layer adjacent to the second ferromagnetic film of the laminated antiparallel pinned layer; and a free ferromagnetic layer adjacent to and in contact with the spacer layer and having a preferred axis of magnetization in the absence of an applied magnetic field that is generally perpendicular to the magnetization axis of the first and second ferromagnetic films in the laminated antiparallel pinned layer.

20. A spin valve magnetoresistive sensor as in claim 19 wherein the substrate is a magnetoresistive shield layer and wherein the seed layer is made of a material selected from the group consisting of tantalum, zirconium, nickel-iron and alumina.

* * * * *

UNITED STATES PATENT AND TRADEMARK OFFICE
CERTIFICATE OF CORRECTION

PATENT NO.   : 5,701,223
DATED        : December 23, 1997
INVENTOR(S)  : R. E. Fontana, Jr., et al.

It is certified that error appears in the above-identified patent and that said Letters Patent is hereby corrected as shown below:

Col. 10, claim 1, line 32, "megnetizations" should read --magnetizations--.

Col. 10, claim 5, line 53, "claim 1" should read --claim 4--.

Col. 11, claim 10, lines 39-40, "pinnel" should read --pinned--;
            line 44, "memory" should read --may--.

Signed and Sealed this

Tenth Day of March, 1998

Attest:

BRUCE LEHMAN

Attesting Officer                Commissioner of Patents and Trademarks